United States Patent [19]

Stein

[11] 3,810,125

[45] May 7, 1974

[54] INTEGRATED CIRCUIT ELECTRICAL CAPACITOR, PARTICULARLY AS A STORAGE ELEMENT FOR SEMICONDUCTOR MEMORIES

[75] Inventor: Karl-Ulrich Stein, Muenchen, Germany

[73] Assignee: Siemens Aktiengesellschaft, Berlin and Munich, Germany

[22] Filed: Sept. 5, 1972

[21] Appl. No.: 286,267

[30] Foreign Application Priority Data

Sept. 30, 1971 Germany............................ 2148948

[52] U.S. Cl. ...... 340/173 CA, 340/173 R, 307/238, 307/279

[51] Int. Cl. ............................................ G11c 11/40

[58] Field of Search ................. 340/173 R, 173 CA

[56] References Cited

UNITED STATES PATENTS 3,706,891 12/1972 Donofrio ...................... 340/173 CA

*Primary Examiner*—Terrell W. Fears
*Attorney, Agent, or Firm*—Hill, Sherman, Meroni, Gross & Simpson

[57] ABSTRACT

An electrical capacitor in an integrated circuit form in or on a semiconductor material wherein the capacitor has an insulating layer on the surface of the semiconductor material and an electrically conductive coating with a terminal, the coating arranged on the insulating layer and extending at least at one point up to the edge of the layer. More specifically, the terminal for an inversion layer of the capacitor has an electrical contact provided in the semiconductor surface which reaches at least at one point up to the edge of a metallic coating forming an electrode on the insulating layer. A terminal is connected to the semiconductor material and an electrical bias source is connected between the terminal and the metallic coating for the application of a voltage to produce an electric field across the insulating layer sufficient to form the inversion layer. A matrix of such capacitors and corresponding integrated circuit field effect transistors employ a common semiconductor substrate wherein the electrodes and the selection lines are formed by a two step metalization process and the digit lines comprise doped regions in the substrate contacting the aforementioned electrical contacts of the inversion layer which are also doped regions.

6 Claims, 5 Drawing Figures

A–A'

INTEGRATED CIRCUIT ELECTRICAL CAPACITOR, PARTICULARLY AS A STORAGE ELEMENT FOR SEMICONDUCTOR MEMORIES

BACKGROUND OF THE INVENTION

1. Field of the Invention

This invention relates to an electrical capacitor in an integrated circuit form in or on a semiconductor material, respectively, wherein the capacitor has an insulating layer which is located on the surface of the semiconductor material and an electrode formed by an electrically conductive coating having a terminal connection, which coating is carried by the insulating layer and extends at least at one point to the edge of the layer. Furthermore, the invention relates to a preferred embodiment of this capacitor, as well as to a particularly advantageous space saving arrangement, wherein a multitude of such capacitors are provided in a storage matrix of a semiconductor memory.

2. Description of the Prior Art

It is generally known to produce capacitors in integrated circuits on semiconductor material by applying an electrically insulating layer and thereupon applying an electrically conductive coating to the surface of the semiconductor material which is rendered conductive by doping in a prescribed region at least on the surface of the semiconductor material. The insulating layer functions as a dielectric between two electrodes whereby one of the electrodes is constituted by the conductive region which is introduced into the semiconductor material and the other electrode is constituted by the metallic coating. Such capacitors have been used, in particular, for single transistor storage elements, as is known from the publication "Electronics" Aug. 2, 1971, Pages 69–75.

Semiconductor memories having single transistor storage elements were previously described in the German Offenlegungsschrift 2,012,090. In semiconductor memories the charge stored in a capacitor as a written-in signal is read by way of a transistor which is controlled by a selection arrangement for the reading process and is accordingly rendered conductive.

Particularly in the case of semiconductor memories with capacitors in the storage elements, the amount of space occupied by the individual storage element is important with respect to the integrated structure. If the individual storage elements occupy a smaller amount of space, the number of storage elements may be increased. This means that a larger storage capacity of the entire memory can be provided for a given amount of space. Particularly in the case of single transistor storage elements, the capacitors of the elements occupy an essential part of the entire available space.

SUMMARY OF THE INVENTION

It is therefore a primary object of the invention to provide an electrical capacitor for an integrated circuit, particularly for use as a storage capacitor in a single transistor storage element, which, while having a prescribed value of capacitance, takes up a particularly small amount of space and, which, can be realized with a self-adjusting gate.

The foregoing object is achieved in a structure which includes a capacitor of the above-mentioned type which, according to the invention, is characterized in that as a terminal connection for an inverse layer of the capacitor an electrical contact is provided in the semiconductor surface, which contact extends, at least at one point, up to the edge of a metallic coating carried on an insulating layer, which is in turn carried on a semiconductor substrate. An electrical terminal is provided at the semiconductor material and an electrical bias source is provided between the metallic coating and the last-mentioned terminal, whereby a voltage is applied which is sufficiently high that, due to the electric field occurring in the insulating layer, an inversion layer forms at the surface of the semiconductor material.

BRIEF DESCRIPTION OF THE DRAWINGS

A semiconductor storage matrix including single transistor storage elements occupies a very small space, if not only the capacitors according to the invention are employed, but if, according to a preferred further development of the invention, such an arrangement is selected for the entity of the storage element.

Other objects, features and advantages of the invention, its organization, construction and operation will be best understood from the following detailed description of preferred embodiments thereof, taken in conjunction with the accompanying drawings, on which.

DESCRIPTION OF THE PREFERRED EMBODIMENTS

Figure 1:
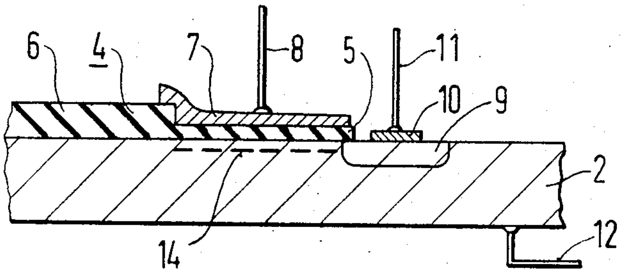
FIG. 1 is a fragmentary sectional elevation of a capacitor constructed in accordance with the principles of the present invention.

In FIG. 1 a semiconductor substrate 2 is illustrated. The substrate may be composed of, for example, *n*-conductive material. In place of the substrate, another substrate could be employed carrying an *n* or *p* conductive semiconductive layer, which is preferably epitaxially grown. A layer 4 consisting of electrically insulating material is carried on a portion of the surface of the substrate 2. The layer 4 has a portion 5 which is substantially thinner than another portion 6. An electrically conductive coating 7 is carried on the surface of the layer 4, particularly over the portion 5 having the lesser layer thickness. This coating 7 is, as is generally known, effective as an electrode of a capacitor and has connected thereto an electric terminal 8. A doped region 9 in the semiconductor material having a conductivity which is opposite to the conductivity of the substrate 2 is provided as an electrical contact. An electrically conductive coating 10 having an electric terminal 11 is provided on a part of the surface of the region 9.

If a voltage which corresponds to the conductivity of the substrate 2 is applied between the terminal 8 and the terminal 12 of the semiconductor material of the substrate 2, an electric conversion layer will form below the portion 5 at or in the surface of the semiconductor material. That is, the inversion layer is provided if, as is generally known, the electric field strength in the insulation layer portion 5 has a sufficiently high value. This inversion layer is indicated by the broken lines and the reference numeral 14. Therefore, of particular concern is a layer at the surface of the semiconductor material wherein, due to the aforementioned electric field, primarily only charge carriers of the particular polarity exists which form the minority carrier in the substrate 2. The conductivity of the predominant charge carrier of the inversion layer 14 thereby corresponds to the conductivity of the region 9. There is an electrical connection between the region 9 and the inversion layer 14, if, as is provided in accordance with the present invention, the region 9 extends at least partially under the layer portion 5 and thereunder below the coating 7. Therewith, the region 9 forms the connecting contact for the layer 14. According to the invention, the capacitor comprises the previously described capacitance with the layer 5 as a dielectric, as well as the capacity between the inversion layer 14 and the substrate 2 which has the opposite conductivity with respect to the layer 14. With this structure, a blocking layer capacitor is provided. If the terminal 12 and the terminal 8 are connected with each other by way of the aforementioned voltage source, both capacitances are connected in parallel with each other. Therefore, according to the invention, the capacitance of the capacitor extends between the terminal 11 and the terminals 8 and 12 combined.

The edge between the portion 6 and the portion 5 of the layer 4 is a limit for the expansion of the inversion layer 14. Due to the larger thickness of the insulation material in the portion 6, the high field strength which is required for the formation of the inversion layer cannot be achieved.

Figure 2:
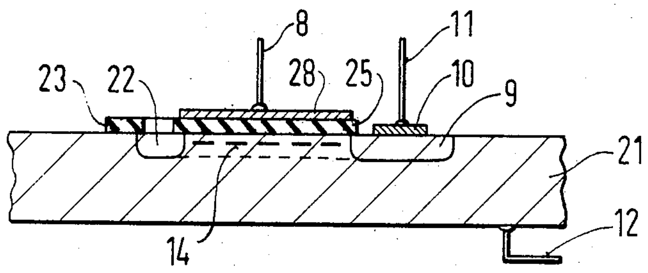
FIG. 2 is a fragmentary sectional elevation of another construction of a capacitor according to the principles of the present invention.

FIG. 2 illustrates another preferred exemplary embodiment of a capacitor according to the present invention. In FIG. 2 the reference 21 designates a substrate which basically corresponds to the substrate 2 in FIG. 1. Details of the structure in FIG. 2 which coincide with those of FIG. 1 have been given the same reference characters. A thin layer 25 comprising electrically insulating material, is carried on a prescribed area of the surface of the substrate 21 and corresponds to the layer portion 5 in FIG. 1, and furthermore an electrically conductive coating 28 is carried by the layer 25. The coating 28 forms one of the electrodes of the capacitor according to the invention. In addition to the doped region 9 in the substrate 21, a further preferably diffused area is located in the substrate wherein the predominant conductivity is opposite to that of the substrate. This area or region 22 extends at least up to and under the edge of the coating 28. Preferably, the region 22 borders the entire area of the coating 28 so that the region 9 and the region 22 surround the coating 28 in a circular manner. The region 22 serves to avoid the formation of particularly high field strength values at the edge of the coating 28 in the insulating layer 25. Such exceedingly high electric field strengths lead to increased blocking currents. It is particularly advantageous to cover the edge of the region 22 which is the outer edge with respect to the coating 28 with a further layer 23 comprising electrically insulating material, and thus avoiding a further expansion of the inversion layer in the semiconductor material which is created by surface charging of the semiconductor surface, as is generally well known.

Figure 3:
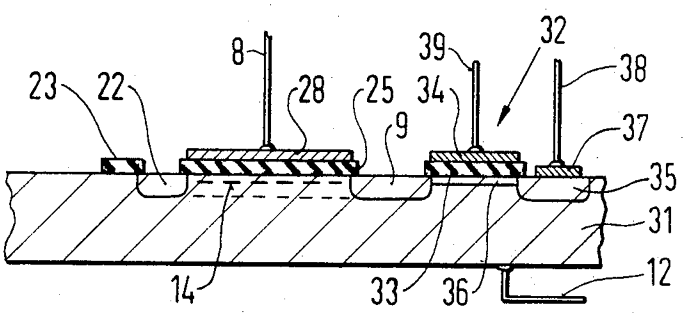
FIG. 3 is a fragmentary sectional elevation view of apparatus including the capacitor set forth in FIG. 2 and a field effect transistor, according to the principles of the present invention.

FIG. 3 illustrates the use of a capacitor according to the invention as a capacitor in a single transistor storage element constructed in accordance with integrated semiconductor techniques. A substrate 31 basically corresponds to the substrates 2 and 21 of FIGS. 1 and 2, respectively. The capacitor chosen for illustration as the exemplary embodiment in FIG. 3 corresponds in structure to the embodiment illustrated in FIG. 2. Designations of details of the capacitor which coincide with those used in FIG. 2 are also employed in FIG. 3. Unlike the exemplary embodiment according to FIG. 2, the electrode coating 10 with the terminal 11 can be omitted from the region 9. The contact to the inversion layer 14 is again formed with the region 9 whereby this contact at the same time constitutes an electrical connection with the transistor 32 illustrated on the right hand side of FIG. 3. Preferably, a field effect transistor is provided as the transistor 32. A gate insulating layer 33 is carried on the substrate 31 and, in turn, carries a gate electrode 34 having an electrical terminal 39 which serves as a terminal for the gate electrode of the transistor 32. A further doped region 35 is provided in the substrate 31. The regions 35 and 39 together form the drain and source regions of the transistor 32. The channel, which forms as well known in the art, is referenced 36. An electrically conductive coating 37 carries a terminal 38 and is disposed on the region 35.

The element illustrated in FIG. 3 comprises the terminal 38 for connection to a digit line, the terminal 39 for connection to a selection line (word line), the terminal 12 together with the terminal 8 for connection to a predetermined potential, for example ground, when the element is operated as a semiconductive storage element in a storage matrix. Between the terminals 8 and 12 the voltage source required for formation of the inversion layer 14 is provided with a correspondingly large electrical voltage.

Figure 4:
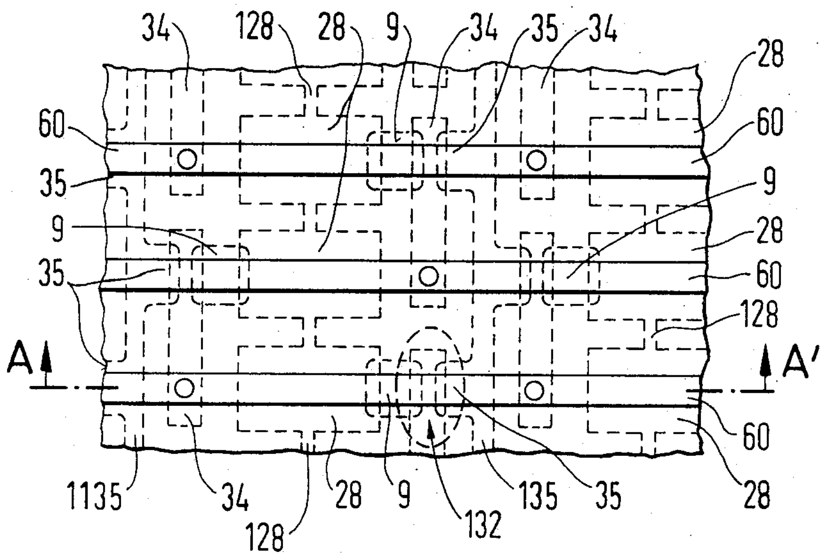
FIG. 4 is a top plan view of a portion of a storage matrix constructed in accordance with the principles of the present invention.

FIG. 4 illustrates in a top view a particularly preferred design for storage matrix employing capacitors constructed according to the present invention. By means of this design, a particularly large packing density of the storage elements utilizing the capacitors according to the invention with very little occupation of space is achieved, because the capacitors themselves have an optimum small space requirement.

Figure 5:
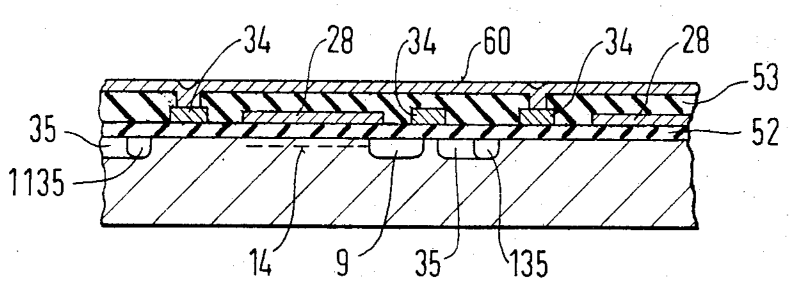
FIG. 5 is a sectional view taken generally along the line A–A' of FIG. 4.

FIG. 5 illustrates a section through the matrix illustrated in FIG. 4, generally along the line A—A'. The substrate 51 carries an insulating layer 52. A further insulating layer 53 carries a selection line 60, illustrated in cross section. Details of the single transistor storage elements in the illustrations of FIGS. 4 and 5 insofar as the details of FIG. 3, coincide at least in their function in accordance with the principles of the invention and have been given the same and/or similar reference characters as employed in FIG. 3.

For better clarity of the details of the storage matrix illustrated in FIGS. 4 and 5 the matrix is illustrated in an enlarged form to show greater distances between the elements than is the case in an actual construction. Details which are only covered by the insulating layer 53 are illustrated with broken lines. Details which are covered by the insulating layer 52 are also illustrated with broken lines. For the sake of better clarity, the region 22 which, according to the exemplary embodiment of FIG. 3 should preferably be provided, has not been illustrated.

In FIG. 4, the single transistor storage elements are arranged in columns and rows according to a matrix principle. The capacitors according to the invention which are denoted by the electrically conductive coating 28 are, as can be seen from the illustration, arranged in individual rows adjacent each other. The coatings 28 of a row are connected with each other by electrically conductive connections 128. Although not illustrated, all of the coatings 28 of the matrix at the terminal 8 (FIG. 3) are connected with each other. As can be seen from FIG. 4, the capacitors of a row such as described above each include a coating 28 and are electrically connected alternately with a digit line 135, as illustrated on the right hand side of the row or with a digit line 1135 located on the left hand side of a row.

The aforementioned alternate connection takes place by way of a transistor 132. The digit lines 135, 1135 are formed by respective strip-shaped, doped, and thereby electrically conductive paths, in the substrate 51. The regions 35 mentioned above are, as can be seen from FIG. 4, branches of the respective digit lines 135, 1135. A transistor 132 in the matrix comprises a region 35, a region 9, a partial piece located between the regions 9 and 35, the insulating layer 32 which covers the partial piece, and the coating 34 which is carried on the insulating layer 52 and having the function of a gate electrode. The coating 34 has a longitudinal strip-like shape, as illustrated in FIG. 4.

Each of the gate electrode coatings 34 is connected with one of the selection lines 60. Therefore, the gate electrode of a certain transistor is connected to the selection line 50 which passes over the coatings 28. In the matrix illustrated in FIG. 4, the selection line to which certain of the coatings 28 are connected, whereby these coatings are horizontally adjacent, passes over the coatings 28 which are in each case located above the coatings 28. By means of the spaced arrangement of the terminals between the gate electrode and the respective selection line, it is provided that the connecting point between gate electrode and selection line cannot have an adverse influence on the function of the respective transistor 132. Preferably, this electrical connection between a gate electrode 34 and a selection line 60, as is obvious from FIG. 5, is produced in such a way that a hole extending through the insulating layer 53 at the cross point to be connected between the gate electrode and the selection line receives material extending as a branch of the selection line. The connection between the gate electrode and the selection line is otherwise carried out in a known manner.

It should be pointed out that the section of the illustrations of FIGS. 4 and 5 provide an exact picture of the design, that is the arrangement of the details with respect to each other. Other details for a design may become apparent to one skilled in the art. As stated above, the design is only reflected with larger distances between the elements in FIGS. 4 and 5 and the region 22, described in connection with FIG. 2, was omitted for reasons of clarity.

The exact shapes of the elements themselves, for example the shape of the coatings 34, the branched off portions 35 and the regions 9, can deviate from the illustration of FIG. 4, as long as the principles of the spatial arrangement of the elements of the design illustrated in FIG. 4 is maintained.

Although I have described my invention by reference to specific illustrative embodiments thereof, many other changes and modifications may become apparent to those skilled in the art without departing from the spirit and scope of the invention. I therefore intend to include within the patent warranted hereon all such changes and modifications as may reasonably and properly be included within the scope of my contribution to the art.

I claim:

1. A storage arrangement comprising: a semiconductor substrate of one conductivity type; a first insulating layer carried on said substrate; a plurality of capacitors arranged in a matrix of columns and rows, each of said capacitors including a first electrode carried on said first insulating layer, an inversion layer in said semiconductor substrate beneath said first insulating layer, a common terminal for all of said capacitors connected to said substrate, a first doped region in said substrate with doping of said opposite type of conductivity and extending up to and beneath said first insulating layer and said first electrode, a second doped region with doping of said opposite conductivity type in said substrate extending up to and beneath and about said first electrode; a plurality of transistors arranged in a matrix of columns and rows, each of said transistors arranged adjacent a respective capacitor and including said substrate, the respective first doped region, a third doped region in said substrate spaced from the respective second doped region and of said opposite type of conductivity, a second electrode carried on said first insulating layer between said first and third doped regions, and a third electrode carried on said third doped region; a plurality of parallel spaced digit conductors carried within said substrate, each of said digit lines connecting aligned ones of said third doped regions; a second insulating layer covering said first electrodes; and a plurality of parallel spaced selection conductors connecting aligned ones of said second electrodes.

2. A storage arrangement according to claim 1, wherein said digit conductors comprise doped regions extending to respective aligned ones of said third doped regions.

3. A storage arrangement according to claim 1, wherein each said transistor includes a self-adjusting gate.

4. A storage arrangement according to claim 3, wherein said gate comprises silicon.

5. A storage arrangement according to claim 1, wherein said electrodes lie in one plane and said selection conductors lie in a second plane due to a two layer metalization process.

6. A storage arrangement according to claim 1, wherein said electrodes comprise a metal having a high melting point.

* * * * *